United States Patent

Pearlman

[11] Patent Number: 5,828,074
[45] Date of Patent: Oct. 27, 1998

[54] OPTOISOLATOR COMPRISING WALLS HAVING PHOTOSENSITIVE INNER SURFACES

[75] Inventor: Alan R. Pearlman, Newton Highlands, Mass.

[73] Assignee: Mini-Systems, Inc., N. Attleboro, Mass.

[21] Appl. No.: 858,279

[22] Filed: May 19, 1997

[51] Int. Cl.$^6$ ................................................. H01L 31/12
[52] U.S. Cl. ........................... 250/551; 257/81; 327/514; 250/239
[58] Field of Search .................................... 250/551, 239, 250/214.1; 327/514, 515; 257/80, 81, 82

[56] References Cited

U.S. PATENT DOCUMENTS

| | | |
|---|---|---|
| 4,114,177 | 9/1978 | King . |
| 4,124,860 | 11/1978 | Johnson .................................. 250/551 |
| 4,322,628 | 3/1982 | Tanaka . |
| 4,354,115 | 10/1982 | Warabisako et al. . |
| 4,450,461 | 5/1984 | Cook et al. ............................... 250/551 |
| 4,477,721 | 10/1984 | Chappell et al. ......................... 250/551 |
| 4,577,114 | 3/1986 | Levy et al. . |
| 5,329,131 | 7/1994 | Vijdenes et al. .......................... 250/551 |
| 5,340,993 | 8/1994 | Salina et al. ............................. 250/551 |

*Primary Examiner*—Edward P. Westin
*Assistant Examiner*—John R. Lee
*Attorney, Agent, or Firm*—Morse & Altman

[57] ABSTRACT

An optoisolator includes one or more light-emitting diodes (LEDs) within a compartment defined by walls of photocells, where the majority of light emitted by the LED impinges directly upon a photocell and is converted to electricity with a minimum of loss. The photocells are attached together by abutting the end of one photocell to the surface of another, as in a butt joint. In one embodiment, the LEDs is inserted into an opening in the compartment and secured by filling the compartment with a light-transmissive, non-conductive material. In another embodiment, the LEDs and photocells are mounted to a substrate. Optionally, each photocell has more than one electrically-independent photosensitive surface.

27 Claims, 4 Drawing Sheets

OPTOISOLATOR COMPRISING WALLS HAVING PHOTOSENSITIVE INNER SURFACES

BACKGROUND OF THE INVENTION

1. Field of the Invention

The present invention relates generally to devices for electrically isolating portions of electronic circuits, and more specifically, to optoisolators, devices that use light-emitting diodes and photodetectors to achieve electrical isolation.

2. The Prior Art

An optoisolator, also known as an optocoupler and photoisolator, is used to electrically isolate two portions of an electronic circuit. There are two basic uses for the optoisolators, power transfer and signal transfer. When used to transfer power, transfer efficiency, the amount of output power per unit of input power, is of primary importance. When used to transfer signals, the transfer efficiency is typically of secondary importance, with switching speed and signal integrity being of primary importance.

Optoisolators modeled after the original optoisolators have two components, a light emitter and a light receiver. These two components are optically coupled together and sealed into a case. Four electrical connections, two for the emitter and two for the receiver, are accessible from the outside of the case. Variations on this basic design are also available, for example, optoisolators with two independent receivers.

The preferred emitter is a light-emitting diode (LED) because it is inexpensive, long-lasting, and reliable. The preferred receiver is a semiconductor photovoltaic cell, or photocell. Photocells are most efficient at converting light in the infrared (IR) band, so IR-emitting LED's are preferred. However, even with the most efficient combination of LED's and photocells, the transfer efficiency is typically only about 0.5%, with some designs reaching almost 1%.

The two primary reasons for low transfer efficiency, the electricity-to-light conversion efficiency of the LED and the light-to-electricity conversion efficiency of the photocell, are not subjects of the present application.

The third primary reason for the low transfer efficiency of optoisolators of the prior art is that much of the light emitted by the LED is not received by the photocell for conversion back to electricity. An LED does not emit light in only one direction. When a photon is released from within the LED, the direction it travels is random. In side-emitting LED's, typically those composed of Gallium Arsenide (GaAs), most of the photons are emitted from near the PN junction of the LED, but in random directions. In top-and-side-emitting LED's, typically those composed of Gallium Aluminum Arsenide (GaAlAs), in addition to being emitted near the PN junction, some photons are emitted through the top layer of the LED, again, in random directions.

Improvements in the design of optoisolators have increased their efficiency by capturing more of the light emitted by the LED. In some newer designs, two or more photocells are used, whether wired in parallel to increase the short-circuit current output or wired in series to increase the open-circuit voltage output. In a typical newer design, a side-emitting LED is located on a pedestal and the photocells are arrayed on the surface below the pedestal. The entire structure is covered by a reflective dome that reflects light from the LED down to the photocells. Although more of the light is converted to electricity than in optoisolators of earlier designs, much is still lost. Only light emitted in particular directions from the LED will be reflected to the photocell array. Also, there are physical gaps between photocells of the array, where more light is lost. Typically transfer efficiencies for these multi-photocell designs range up to about 1%.

SUMMARY OF THE INVENTION

The object of the present invention is to provide an optoisolator with a significantly greater transfer efficiency than optoisolators of the present art.

Another object of the present invention is to provide a device by which isolated electrical power can be transferred optically with a significantly greater efficiency than devices of the present art.

The optoisolator of the present invention includes an enclosure and a light source. Because of its compatibility with the electrical circuits in which the optoisolator of the present invention will typically be used, the preferred light source is one or more light-emitting diodes (LEDs).

The enclosure defines a compartment within which the light source resides. The critical aspect of the present invention is that the inner surface of the walls of the enclosure are photosensitive, producing electricity when illuminated. The consequence is an optoisolator where the majority of light emitted by the light source impinges directly upon a photocell and is converted to electricity with a minimum of loss. There is no particular preferred shape for the enclosure, although the most preferred shape is cubical, primarily because it is the easiest shape to work with.

The most preferred way of making the walls photosensitive is by constructing the walls themselves from photocells. The photocells must be rigid enough to maintain the compartment and not collapse or expand under normal stresses, requirements met by current state-of-art photocells. The less preferred method is to permanently attach a photocell to a rigid sheet of non-conductive material that acts as the wall.

One way to connect the walls together is edge-to-edge, where the photocells are only as wide as necessary to create the compartment. The major drawback is that the electrical connections between the photocells must go through the joints, potentially weakening the joint and making manufacture more difficult. The most preferred way to connect the walls is to use photocells that are larger than necessary to create the compartment and overlap the ends. The edge of one wall abuts the photosensitive surface of the adjacent wall, as in a butt joint, so that the photosensitive surface of the second wall extends outside of the compartment. The electrical connection can be made at that junction outside the compartment.

There are two basic embodiments of the present invention. In one embodiment, the light source is inserted into the open side of the enclosure and secured into position by filling the compartment with a transparent clear material, such as an epoxy. Filling the compartment also increases physical stability of the enclosure and increases the electrical isolation characteristics of the optoisolator. External electrical connections are made via a pair of conductive leads extending from the light source and from pads on the photocells.

In the second embodiment, the light source and enclosure are mounted permanently to a rigid, nonconductive substrate. The light source is oriented so that the minimum amount of light it emits directly impinges on the substrate, maximizing the light received by the photosensitive walls. Optionally, the compartment is filled with a transparent clear material in order to increase its physical stability and electrical isolation characteristics. Electrical access depends upon the form of substrate, such as pins on a dual-in-line package or pads on a surface-mount package.

The maximum open-circuit voltage or short-circuit current is limited by the number of photocells. In some instances, greater outputs may be needed. The photocell walls of the enclosure can be manufactured with multiple photosensitive areas adjacent to each other, rather than just one. The resulting extra electrical outputs can be wired together as desired to increase output voltage or current.

Other objects of the present invention will become apparent in light of the following drawings and detailed description of the invention.

BRIEF DESCRIPTION OF THE DRAWINGS

For a fuller understanding of the nature and object of the present invention, reference is made to the accompanying drawings, wherein.

DETAILED DESCRIPTION

Figure 1:
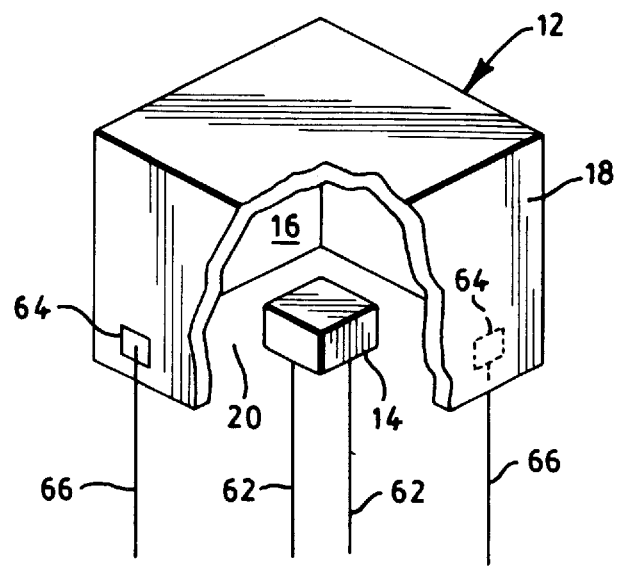
FIG. 1 shows a perspective view in partial cutaway of a cube configuration of one basic embodiment of the optoisolator of the present invention.
Figure 2:
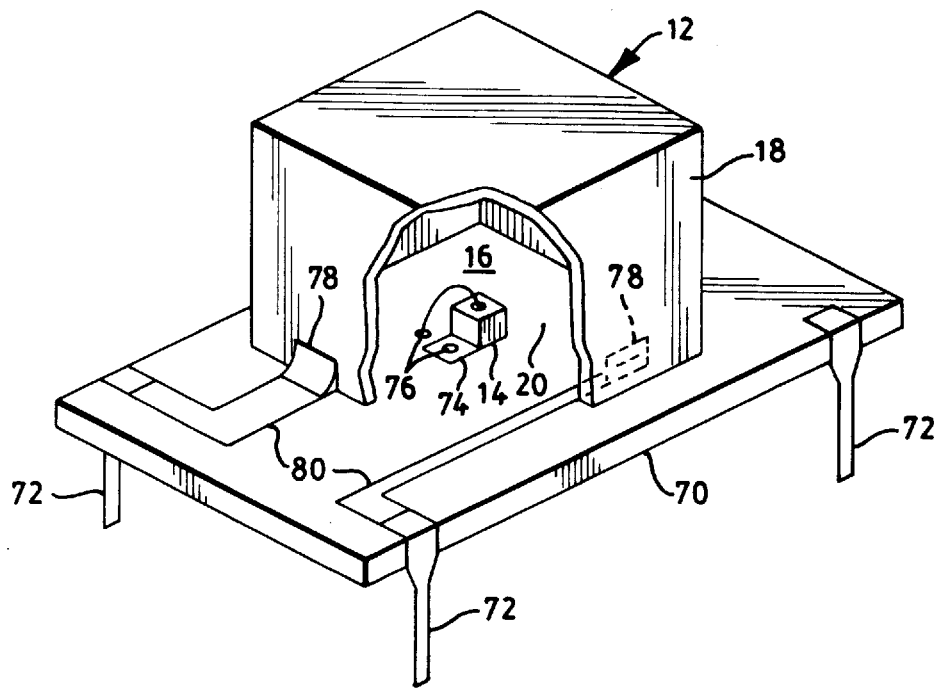
FIG. 2 shows a perspective view in partial cutaway of a cube configuration of another basic embodiment of the optoisolator of the present invention.

Two basic embodiments of the optoisolator of the present invention are shown in FIGS. 1 and 2. The primary components include an enclosure 12 and a light source 14.

The preferred light source 14 is one or more light-emitting diodes (LEDs). LEDs have existed for many years and their properties are well-known. LEDs are compatible with the voltage and current levels found in the electrical circuits in which the optoisolator of the present invention will typically be used.

The enclosure 12 defines a compartment 16 within which the light source 14 resides. The critical aspect of the present invention is that a significant portion of the inner surface of the walls 18 of the enclosure 12 are photosensitive, producing electricity when illuminated by the light source 14. The consequence of this arrangement is that it is now possible to construct an optoisolator where the majority of light emitted by the light source impinges directly upon a photocell and is converted to electricity with a minimum of loss.

One form of enclosure 12, shown in FIGS. 1 and 2, uses five walls 18 having photosensitive inner surfaces to define a cubical compartment 16. Note that one side of the compartment 16 is open, as at 20, so that the light source 14 may be inserted into the compartment 12. The cubical shape is merely illustrative, as any enclosing shape is contemplated by the present invention. Other such shapes include pyramids, tetrahedrons, octahedrons, dodecahedrons, icosahedrons, etc.

There are two preferred ways to make the enclosure walls 18 photosensitive. The most preferred is to construct the walls 18 from the photocells themselves. In order to be able to do so, the photocells must be rigid enough to maintain the compartment 16 and not collapse or expand under normal stresses. And they must have surfaces that can be permanently adhered to the surface of other photocells without impairing the ability of the photocell to convert light to electricity. Current state-of-art photocells adequately meet these requirements.

The less preferred method for making the walls photosensitive is to permanently attach a photocell to a rigid sheet of non-conductive material that acts as the wall. This method is necessary when the photocells are not rigid enough to be walls when unsupported. Although, as stated above, current photocells are rigid enough to stand alone, it is possible that a new photocell will be developed that has a greater light-to-electricity conversion efficiency, but that is not rigid enough to stand alone as a wall.

The typical photocell for use with the present invention has a pair of electrical connections, one on the front photosensitive surface and one on the rear nonphotosensitive surface. Generally, metallic terminal pads are attached to the surfaces to facilitate the bonding of electrical wires to the photocell. The most common methods for forming an electrical bond include heat soldering and conductive cement, both well-known in the art.

Figure 3:
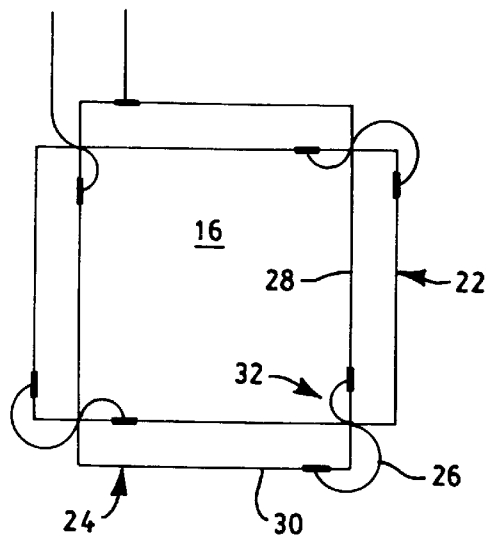
FIG. 3 shows a top view of one method of attaching the side walls to each other.

FIG. 3 shows one way in which the photocells 22, 24 are connected together to form the enclosure 12. The photocells 22, 24 are only as wide as necessary to create the compartment 16 and are cemented together. Electrical connections between the photocells are made by electrical wires 26 soldered to the terminal pads of the photocells. The advantage to this arrangement is that it can be used to transfer signals. All of the photosensitive surfaces are within the compartment 16, illuminated only by the light source 14, and so are isolated from external light.

There is, however, a major drawback. Because the wires 26 go from the front 28 of one photocell 22 to the rear 30 of another photocell 24, the wire 26 must be routed through the junction 32 between two photocells 22, 24. This requires either that there be a gap between the photocells 22, 24 or that a small nick be made in the photocells 22, 24 to fit the wire 26. Neither is particularly satisfactory because of the potential for not completely enclosing the light source 14, the potential for physically weakening the photocell, and the extra steps needed in the manufacturing process.

Figure 4:
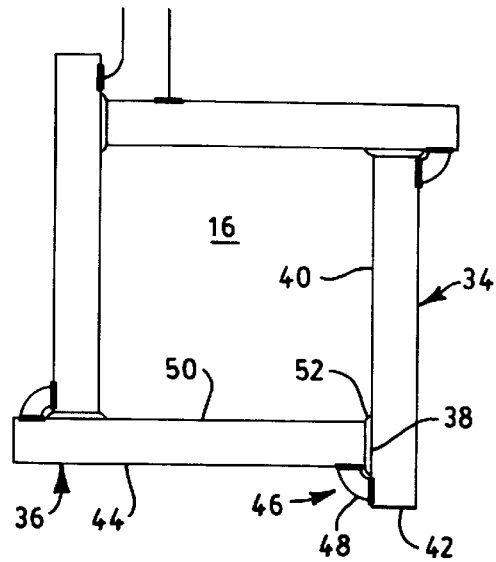
FIG. 4 shows a top view of another method of attaching the side walls to each other.

Another preferred arrangement, the butt joint, is shown in FIG. 4. The walls 34, 36 are larger than necessary to create the compartment 16, causing an overlap. The edge 38 of the first wall 36 abuts the photosensitive surface 40 of the second wall 34 at a short distance from the edge 42 of the second wall 36. Consequently, the photosensitive surface 40 of the second wall 34 extends outside of the compartment 16 and is adjacent to the rear surface 44 of the first wall 36. The electrical connection can be made at that junction 46 outside the compartment 16. In addition, no wires are necessary to connect the photocell walls. The connection can be made by electrically bonding the two photocell walls directly together at the junction, as at 48, by, for example, soldering or applying a conductive cement. The photocell walls may be bonded together along the entire length of the junction 46 to provide greater structural integrity to the enclosure 12. To prevent electrical contact between the photosensitive surface 50 of the first wall 36 and the photosensitive surface 40 of the second wall 34, an insulator 52 is inserted between the walls. The insulator 52 may be a strip of insulating material or merely an air gap left during construction. The butt joint arrangement is only effective when the present invention is used to transfer power. The portions of the photosensitive surfaces outside the compartment 16 are typically illuminated by external light, severely impacting the accurate transfer of signals.

Figure 5:
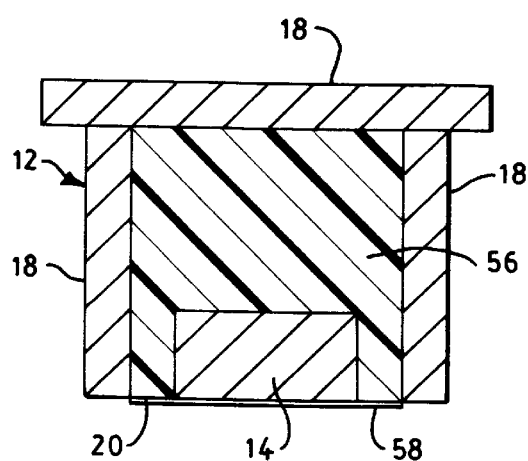
FIG. 5 shows a side, cross-sectional view of a filled compartment.

In the embodiment of FIG. 1, the light source 14 is inserted into the open side 20 of the enclosure 12, aligned within the compartment 16, and secured into position by filling the compartment 16 with a transparent clear material, such as an epoxy, as at 56 of FIG. 5. Filling the compartment 16 also increases physical stability of the enclosure 12, making the optoisolator less susceptible to physical stresses. In addition, using an appropriate material to fill the compartment 16 increases the electrical isolation characteristics of the optoisolator. The electrical isolation is a function of the distance between the light source 14 and photocell walls 18 and the electrical conductivity of the material that separates them. There are a number of clear materials, including epoxy, that are less conductive than air and using one of these materials to fill the compartment 16 decreases the conductivity between the light source 14 and photocell walls 18, increasing the electrical isolation.

When used to transfer power, it is not necessary that the compartment be opaque to external light. In fact, any external light leaking into the compartment can actually increase the output of the optoisolator. However, a greater increase in the transfer efficiency is obtained by coating the transparent clear material 56 filling the opening 20 with a light-colored or reflective material 58. This coating 58 causes some of the light impinging on it to be reflected back to the photocells.

When used to transfer signals, any light other than that of the light source will interfere with the light from the light source, causing erroneous signals at the photocell output and rendering the optoisolator useless. It is, therefore, necessary that the compartment be opaque to external light. In this embodiment of the present invention, one preferred method for rendering the compartment 16 opaque to external light is the same as above, to coat the transparent clear material 56 filling the opening 20 with a light-colored or reflective material 58. The coating 58 must be more thorough and complete than when the optoisolator is used to transfer power. Another method includes building a floor into the enclosure, with an opening for the light source 14. The opening is just large enough for the light source, so that the resulting minimal gap can be easily sealed. Preferably, the inner surface of the floor is coated with a light-colored or reflective material.

External electrical connections are made to the optoisolator via a pair of conductive leads 62 extending from the light source 14 and from pads 64 on the photocells. In the typical optoisolator of the present invention, all of the photocells are wired in series, so that there are only two external electrical connections to the photocells, as at 66. However, a variety of photocell wiring arrangements are possible, including parallel wiring, combinations of parallel and serial wiring, and independent outputs of each photocell and/or groups of photocells so that the user may wire the photocells as needed for the particular application.

In the embodiment of FIG. 2, the light source 14 is mounted permanently to a substrate 70 composed of a rigid, nonconductive material, such as a ceramic. The mounting is such that the normal stresses to which the optoisolator is subjected will not cause the light source 14 to become dislodged. Typically the light source 14 is mounted by solder or conductive cement to a printed conductor 74. The enclosure 12 is placed over the light source 14 and secured to the substrate 70. The enclosure 12 can be secured to the substrate 70 by soldering or cementing it directly to a printed conductor 74 on the substrate 70 or by attaching it to clips secured to the substrate 70.

This embodiment is preferred when the optoisolator is used to transfer signals because it is easier to make the compartment 16 opaque to external light. It is easier to seal the narrow seams between the walls 18 and substrate 70 than to seal the larger opening 20 of the embodiment of FIG. 1. The transparent clear material 56 used to fill the compartment 16 of the embodiment of FIG. 1 hardens with a rough surface in the opening 20. When coating the rough surface, it is difficult to make sure that all the nooks and crannies are covered by the coating.

The light source 14 is oriented so that the minimum amount of light it emits directly impinges on the substrate 70, maximizing the light received by the photosensitive walls 18. When the light source 14 is an LED, this generally means that the LED is mounted so that its PN junction is approximately parallel to the surface of the substrate 70. Preferably, those portions of the substrate 70 receiving light from the light source 14 are coated with a light-colored or reflective material so that at least a portion of that light is reflected to a photosensitive surface. Optionally, those portions of the substrate 70 that are not physically covered by the light source 14 are also photosensitive, increasing the amount of photosensitive surface area to substantially all of the inner surface of the enclosure 12 that is not covered by the light source 14. Optionally, the compartment 16 is filled with a transparent clear material, such as epoxy, as discussed above with reference to FIG. 1.

In this embodiment, the light source 14 and photocells 18 are accessed electrically by contacts 72 on the substrate 70. The physical form that the contacts 72 take depends upon the packaging of the optoisolator. For example, the contacts will be pins on a dual-in-line package (DIP), as in FIG. 2, or they will be pads on a surface-mount technology (SMT) package. The light source 14 and photocell walls 18 are electrically connected to the contacts 72 by discrete wires or by conductors printed on the substrate 70. Because the photocell walls 18 enclose the light source 14, the light source conductors cannot go directly to the contacts 72. They are, instead, routed through vias 76 to the other side of the substrate 70 and then by printed conductors to the contacts 72. The photocell walls 18 are electrically connected to printed contacts 80 by solder or conductive epoxy 78.

Figure 6:
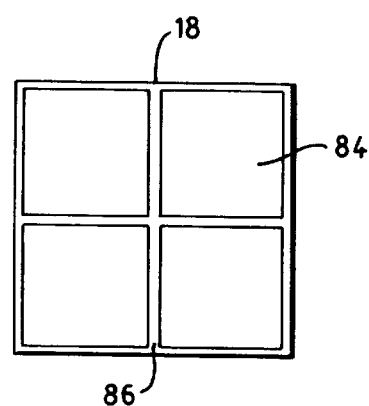
FIG. 6 shows an alternate embodiment of a photocell face having more than one photosensitive surface.

Electrically connecting the photocells in series increases the open-circuit output voltage and electrically connecting the photocells in parallel increases the short-circuit output current (although, in either case, the total output power remains the same). The maximum voltage or current is limited by the number of photocells. For example, if the enclosure 12 is configured as a cube with five photocells, connecting them in series yields a maximum open circuit voltage of about 2.5 volts. Some situations require a higher voltage, albeit at a lower current. The photocell walls of the enclosure 12 can be manufactured with multiple photosensitive areas adjacent to each other, rather than just one. As in the example shown in FIG. 6, if each wall 18 has four photosensitive areas 84 wired in series, the maximum open circuit voltage is increased four-fold. The shortcoming is that, in order to maintain the necessary electrical isolation between the photosensitive areas 84, there must be nonphotosensitive gaps 86 separating the photosensitive areas 84 of the wall 18. Consequently, less of the light emitted by the light source 14 impinges upon a photosensitive surface, resulting in more lost light. However, the amount of lost light is a small fraction of the overall light received by the photosensitive surfaces, and only minimally impacts the transfer efficiency.

Figure 7:
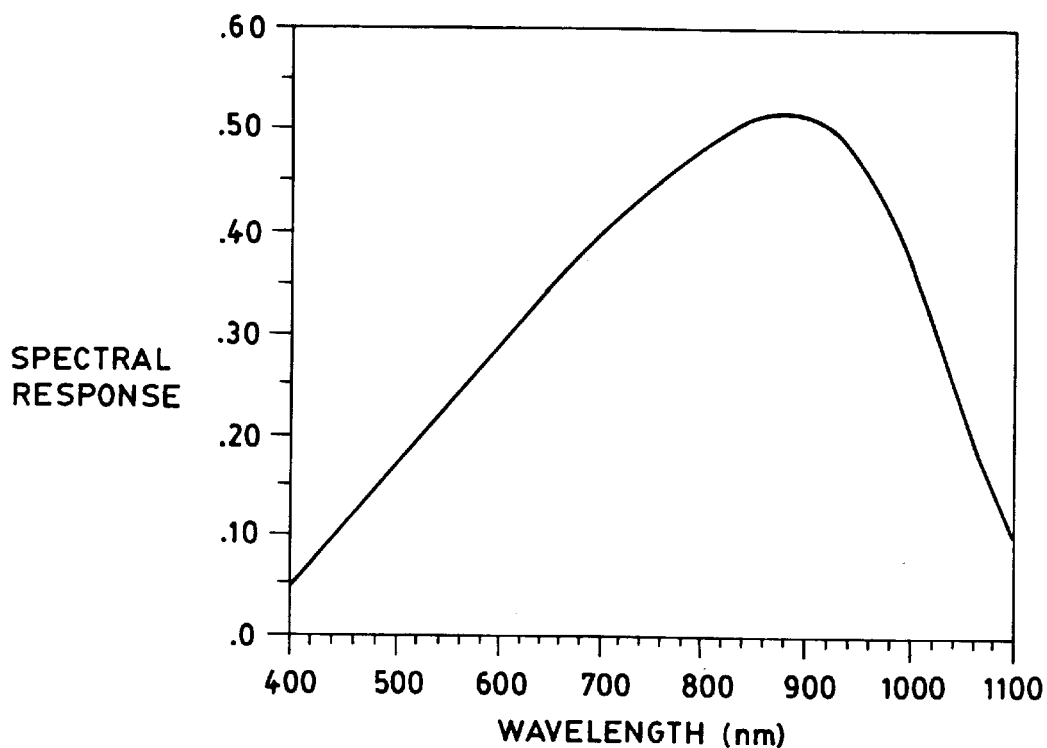
FIG. 7 shows a light spectrum verses output curve for a typical photocell.
Figure 8:
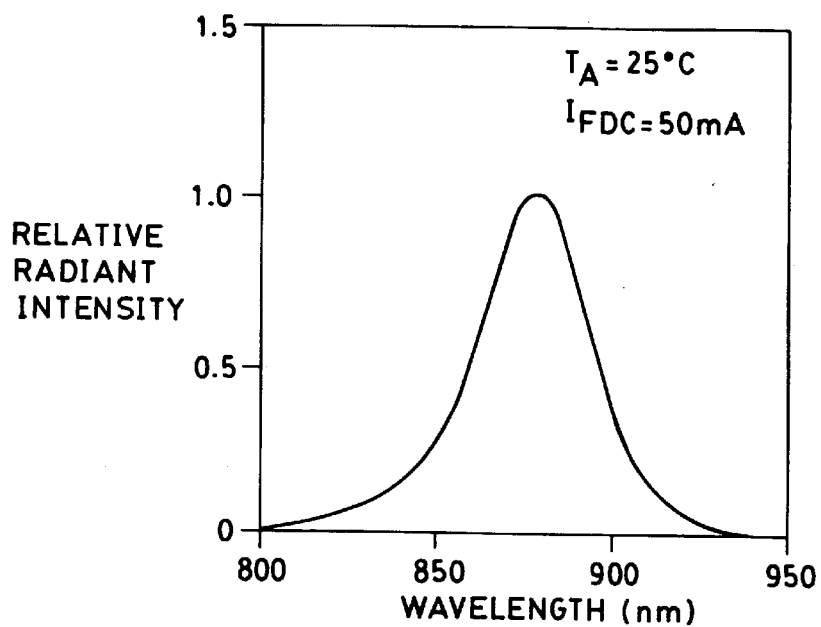
FIG. 8 shows a radiant intensity verses wavelength curve for a typical LED used in the present invention.

The output of a photocell is a function of the spectrum of the light incident upon it. As seen in the curve of FIG. 7, the preferred photocells respond to a wide frequency range. They are sensitive to a wide range of wavelengths, and are most efficient at approximately 880 nanometers (nm). Consequently, the preferred light source radiates most strongly in the lower infrared wavelength spectrum where the photocells are most sensitive. FIG. 8 is a curve showing relative radiant intensity verses wavelength for the preferred light source, an LED. Note that the radiant intensity peaks at approximately 880 nm, which is near the lower end of the infrared wavelength spectrum at 750 nm and close to the 880 nm wavelength at which the photocells are most efficient.

Figure 9:
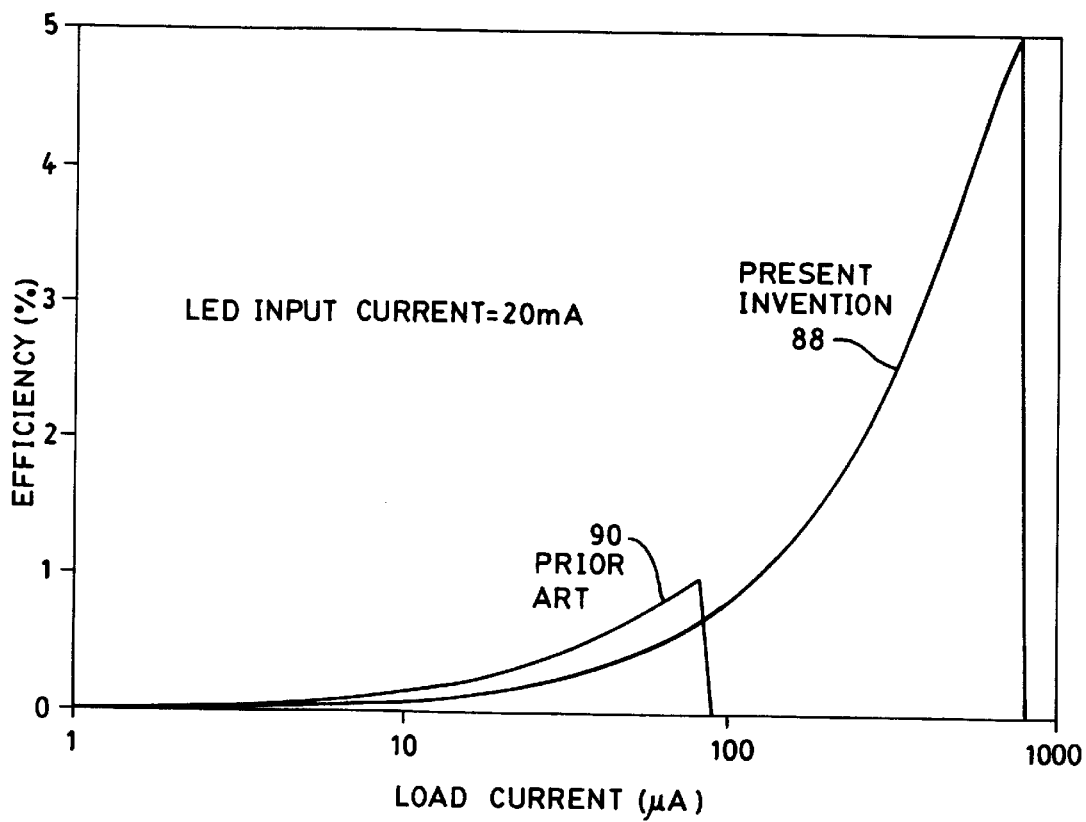
FIG. 9 shows the transfer curve of the present invention compared to the transfer curve of typical optoisolators of the prior art.

FIG. 9 shows the experimentally determined transfer efficiency curve 88 of the optoisolator of the present invention in comparison to transfer efficiency curve 90 of the typical prior art optoisolator. The maximum transfer efficiency of the prior art optoisolator is approximately 1%. On the other hand, experimental data shows that the maximum transfer efficiency of the optoisolator of the present invention approaches 5%, a five-fold increase over current optoisolators.

Thus it has been shown and described an optoisolator which satisfies the objects set forth above.

Since certain changes may be made in the present disclosure without departing from the scope of the present invention, it is intended that all matter described in the foregoing specification and shown in the accompanying drawings be interpreted as illustrative and not in a limiting sense.

What is claimed is:

1. An optoisolator comprising:
   (a) an enclosure including walls defining a compartment, each of said walls having an inner surface, said inner surface of at least two of said walls having a photosensitive portion, said photosensitive portions having different orientations with respect to each other, and each of said photosensitive portions producing at least one electrical signal when illuminated;
   (b) a light source within said compartment providing light to illuminate said inner surfaces when said light source is energized;
   (c) electrical contacts for providing electricity to energize said light source; and
   (d) electrical contacts for receiving said at least one electrical signal from said photosensitive portions.

2. The optoisolator of claim 1 wherein said photosensitive portion of each of said inner surfaces is a single contiguous photosensitive area producing an electrical signal when illuminated.

3. The optoisolator of claim 1 wherein said photosensitive portion of each of said inner surfaces includes a plurality of electrically-isolated photosensitive areas, each of said photosensitive areas producing an independent electrical signal when illuminated.

4. The optoisolator of claim 1 wherein each of said walls is a photocell.

5. The optoisolator of claim 1 wherein the junction of each pair of adjacent walls is formed by an edge of a first of said pair of adjacent walls abutting said inner surface of a second of said pair of adjacent walls such that said inner surface of said first of said pair of adjacent walls extends outside of said compartment.

6. The optoisolator of claim 1 wherein said light source is at least one light-emitting diode.

7. The optoisolator of claim 1 wherein said compartment is substantially filled with a light-transmissive, non-electrically-conductive material.

8. The optoisolator of claim 1 wherein said compartment has an opening through which said light source electrical contacts extend out of said compartment, and wherein a light-transmissive, non-electrically-conductive material fills said compartment and secures said light source within said compartment.

9. The optoisolator of claim 1 wherein said light source and said enclosure are mounted on a substrate, said substrate providing a floor for said compartment, said floor having an inner surface in said compartment.

10. The optoisolator of claim 9 wherein said floor inner surface includes at least one photosensitive portion illuminated by said light source and that produces an electrical signal when illuminated.

11. An optoisolator comprising:
    (a) an enclosure including walls composed substantially of photocells and defining a compartment, each of said photocells having a photosensitive inner surface that is a single contiguous photosensitive area producing an electrical signal when illuminated;
    (b) at least one light-emitting diode within said compartment providing light to illuminate said photosensitive inner surfaces when said at least one light-emitting diode is energized;
    (c) electrical contacts for providing electricity to energize said at least one light-emitting diode; and
    (d) electrical contacts for receiving said electrical signals from said photosensitive inner surfaces.

12. The optoisolator of claim 11 wherein the junction of each pair of adjacent walls is formed by an edge of a first of said pair of adjacent walls abutting said inner surface of a second of said pair of adjacent walls such that said inner surface of said first of said pair of adjacent walls extends outside of said compartment.

13. The optoisolator of claim 11 wherein said compartment is substantially filled with a light-transmissive, non-electrically-conductive material.

14. The optoisolator of claim 11 wherein said compartment has an opening through which said light-emitting diode electrical contacts extend out of said compartment, and wherein a light-transmissive, non-electrically-conductive material fills said compartment and secures said at least one light-emitting diode within said compartment.

15. The optoisolator of claim 11 wherein said at least one light-emitting diode and said enclosure are mounted on a substrate, said substrate providing a floor for said compartment, said floor having an inner surface in said compartment.

16. The optoisolator of claim 15 wherein said floor inner surface includes at least one photosensitive portion illuminated by said at least one light-emitting diode and that produces an electrical signal when illuminated.

17. An optoisolator comprising:
    (a) an enclosure including walls composed substantially of photocells and defining a compartment, each of said photocells having a photosensitive inner surface that is a single contiguous photosensitive area producing an electrical signal when illuminated;

(b) the junction of each pair of adjacent walls is formed by an edge of a first of said pair of adjacent walls abutting said inner surface of a second of said pair of adjacent walls such that said inner surface of said first of said pair of adjacent walls extends outside of said compartment;

(c) at least one light-emitting diode within said compartment providing light to illuminate said photosensitive inner surfaces when said at least one light-emitting diode is energized;

(d) electrical contacts for providing electricity to energize said at least one light-emitting diode;

(e) electrical contacts for receiving said electrical signals from said photosensitive inner surfaces; and (f) said compartment having an opening through which said light-emitting diode electrical contacts extend out of said compartment, and wherein said at least one light-emitting diode is secured within said compartment by a light-transmissive, non-electrically-conductive material that substantially fills said compartment.

18. An optoisolator comprising:

(a) an enclosure including at least three walls defining a compartment, each of said walls having an inner surface, each of said inner surfaces having a photosensitive portion, said photosensitive portions having different orientations with respect to each other, and each of said photosensitive portions producing at least one electrical signal when illuminated;

(b) a light source within said compartment providing light to illuminate said inner surfaces when said light source is energized;

(c) electrical contacts for providing electricity to energize said light source; and (d) electrical contacts for receiving said at least one electrical signal from said photosensitive portions.

19. The optoisolator of claim 18 wherein said photosensitive portion of each of said inner surfaces is a single contiguous photosensitive area producing an electrical signal when illuminated.

20. The optoisolator of claim 18 wherein said photosensitive portion of each of said inner surfaces includes a plurality of electrically-isolated photosensitive areas, each of said photosensitive areas producing an independent electrical signal when illuminated.

21. The optoisolator of claim 18 wherein each of said walls is a photocell.

22. The optoisolator of claim 18 wherein the junction of each pair of adjacent walls is formed by an edge of a first of said pair of adjacent walls abutting said inner surface of a second of said pair of adjacent walls such that said inner surface of said first of said pair of adjacent walls extends outside of said compartment.

23. The optoisolator of claim 18 wherein said light source is at least one light-emitting diode.

24. The optoisolator of claim 18 wherein said compartment is substantially filled with a light-transmissive, non-electrically-conductive material.

25. The optoisolator of claim 18 wherein said compartment has an opening through which said light source electrical contacts extend out of said compartment, and wherein a light-transmissive, non-electrically-conductive material fills said compartment and secures said light source within said compartment.

26. The optoisolator of claim 18 wherein said light source and said enclosure are mounted on a substrate, said substrate providing a floor for said compartment, said floor having an inner surface in said compartment.

27. The optoisolator of claim 26 wherein said floor inner surface includes at least one photosensitive portion illuminated by said light source and that produces an electrical signal when illuminated.

* * * * *